US007555834B2

(12) United States Patent
Perugini

(10) Patent No.: US 7,555,834 B2
(45) Date of Patent: Jul. 7, 2009

(54) METHOD OF MANUFACTURING AN INTERCONNECTION DEVICE

(75) Inventor: Michael N. Perugini, Monroe, CT (US)

(73) Assignee: Integrated System Technologies, LLC, Monroe, CT (US)

( * ) Notice: Subject to any disclaimer, the term of this patent is extended or adjusted under 35 U.S.C. 154(b) by 230 days.

(21) Appl. No.: 11/634,298

(22) Filed: Dec. 5, 2006

(65) Prior Publication Data

US 2007/0077787 A1 Apr. 5, 2007

Related U.S. Application Data

(62) Division of application No. 10/966,872, filed on Oct. 15, 2004, now Pat. No. 7,186,119.

(60) Provisional application No. 60/512,127, filed on Oct. 17, 2003.

(51) Int. Cl.
*H01R 9/00* (2006.01)
*H05K 1/00* (2006.01)

(52) U.S. Cl. ............................. 29/842; 29/844; 29/845; 439/66

(58) Field of Classification Search ................... 29/842, 29/844, 845; 439/66
See application file for complete search history.

(56) References Cited

U.S. PATENT DOCUMENTS

| | | | |
|---|---|---|---|
| 3,631,380 A | 12/1971 | Bohn | |
| 4,511,196 A | 4/1985 | Schuler et al. | |
| 4,678,252 A | 7/1987 | Moore | |
| 4,927,369 A | 5/1990 | Grabbe et al. | |
| 4,998,886 A | 3/1991 | Werner | |
| 5,230,632 A | 7/1993 | Baumberger et al. | |
| 5,653,598 A * | 8/1997 | Grabbe | 439/66 |
| 5,759,048 A | 6/1998 | Korsunsky et al. | |
| 5,829,988 A | 11/1998 | McMillan et al. | |
| 5,904,580 A | 5/1999 | Kozel et al. | |
| 5,938,451 A | 8/1999 | Rathburn | |
| 5,984,693 A | 11/1999 | McHugh et al. | |
| 6,065,977 A | 5/2000 | Toda et al. | |
| 6,068,514 A | 5/2000 | Zuin | |
| 6,106,305 A | 8/2000 | Kozel et al. | |
| 6,146,152 A * | 11/2000 | McHugh et al. | 439/66 |
| 6,176,707 B1 | 1/2001 | Neidich et al. | |

(Continued)

OTHER PUBLICATIONS

James Rathburn, "Replaceable Chip Module (RCM™)", *IEEE,* pp. 393-398 (1998).

*Primary Examiner*—C. J Arbes
(74) *Attorney, Agent, or Firm*—Occhiuti Rohlicek & Tsao LLP

(57) ABSTRACT

Methods of manufacture of interconnection devices that include using a non-forming process to manufacture a plurality of compression contacts, each compression contact including a cantilevered beam portion that is tapered along its length, and disposing each of the plurality of contacts within a respective cavity in a substantially planar carrier housing lying in a plane defined by x and y axes, the housing having an upper surface and a lower surface, each cavity extending between the upper and lower surfaces of the housing substantially along a z axis, each contact being loosely retained within its respective cavity such that an entirety of the contact in a compressed state has at least some freedom of movement along the x and y axes.

46 Claims, 7 Drawing Sheets

U.S. PATENT DOCUMENTS 6,203,351 B1 * 3/2001 Okabe ........................ 439/352
6,210,176 B1 * 4/2001 Hsiao ............................ 439/7
6,217,342 B1 4/2001 Neidich et al.
6,241,531 B1 6/2001 Roath et al.
6,257,899 B1 * 7/2001 Walkup ....................... 439/66
6,287,126 B1 9/2001 Berger et al.
6,290,507 B1 9/2001 Neidich et al.
6,315,576 B1 11/2001 Neidich
6,345,987 B1 2/2002 Mori et al.
6,888,362 B2 5/2005 Eldridge et al.
6,921,270 B2 * 7/2005 Mendenhall et al. .......... 439/66
7,094,062 B2 * 8/2006 Ramey et al. ................. 439/66
7,261,567 B2 * 8/2007 Mendenhall et al. .......... 439/66
7,263,770 B2 * 9/2007 Mendenhall et al. .......... 29/856

* cited by examiner

METHOD OF MANUFACTURING AN INTERCONNECTION DEVICE

CLAIM OF PRIORITY

This application is a divisional of U.S. application Ser. No. 10/966,872, filed on Oct. 15, 2004 now U.S. Pat. No. 7,186,119, which claims the benefit of U.S. Provisional Application No. 60/512,127, filed Oct. 17, 2003. The entire contents of U.S. application Ser. No. 10/966,872 and U.S. Provisional Application No. 60/512,127 are incorporated herein by reference.

TECHNICAL FIELD

This disclosure relates to electrical interconnection devices and methods for manufacturing such devices.

BACKGROUND

Solderless compression interconnection devices are typically used to releasably connect two or more electrical components, such as an integrated circuit to a printed circuit board. Because contacts within a solderless interconnection devices are compressed in order to provide an electrical connection between mated components, strain is exerted both on the compressed contacts as well as the mated electrical components. Thermal expansion of mated components as well as the interconnection device may lead to additional strain on the compressed contacts and mated components. Excessive strain can cause the compression contacts to fail, thus interrupting the electrical connection between mated components.

SUMMARY

In one aspect the invention features an interconnection device that includes a carrier housing formed of insulative material and having at least one cavity extending through the housing. Within the cavity is disposed a non-formed compression contact that includes a cantilevered beam portion that is tapered along its length.

In one particular implementation, the cantilevered beam portion of the contact is tapered such that deflection of the beam occurs across substantially the entire length of the beam when a compression force is applied to the beam. The cantilevered beam portion of the contact may be tapered such that an outer surface of the cantilevered beam has a generally concave shape near the fulcrum of the beam and a generally convex shape near the distal end of the beam.

In another implementation, the compression contact includes a second tapered, cantilevered beam portion having a length and projecting from the same fulcrum as the first cantilevered beam portion (e.g., forming a “C”-shaped contact). Both the first and second cantilevered beams may be tapered such that deflection of the respective beam occurs across substantially the entire length of the beam when a compression force is applied to the beam. Each of the cantilevered beams may further include an inwardly depending member extending from the distal end of the cantilevered beam portion. These inwardly depending members may be configured to engage each other after the first and second cantilevered beam portions have been compressed a predetermined amount. Alternatively, the inwardly depending members may be configured to slide against each other causing the contact to rotate as a compression force is applied to the contact, thus creating a wiping motion at a mated interface when a compression force is applied to the contact.

In another implementation, the compression contact is loosely retained in the carrier housing such that the compression contact has some freedom of movement in directions parallel to a broad surface of the carrier housing. The contact may be disposed in the carrier housing so as to slide against a respective contact pad during engagement.

Another aspect of the invention features a substantially planar interconnection device (wherein the major plane of the device defines the x and y directions) that includes a carrier housing formed of insulative material and having a plurality of cavities extending through the housing. Within each cavity, one or more compression contacts are loosely retained such that each contact has at least some freedom of movement in at least the x and y direction.

In one implementation, the compression contacts are retained in the housing such that they have at least some freedom of movement in the direction perpendicular to the x and y direction (i.e., the z direction).

In another implementation, the compressions contacts are non-formed contact, each having a first and second tapered cantilevered beam portion extending from a common fulcrum. The beams may be tapered such that deflection of the respective beam occurs across substantially the entire length of the beam when a compression force is applied to the beam.

In another implementation, each of the cavities defines a first sidewall and the carrier housing comprises a protrusion extending into the cavity. In this implementation, each contact may be C-shaped and at least partially surround the protrusion. Multiple contacts (e.g., two contact) may be disposed in each cavity to provide multiple connection paths between contacting surfaces.

In another aspect, the invention feature a method of manufacture of an interconnection device that includes using a non-forming process (e.g., die-cutting, stamping, punching, blanking, etc.) to create a plurality of compression contacts, each of which includes a cantilevered beam portion that is tapered along its length. The method also includes disposing each of the plurality of contacts within a respective cavity in a substantially planar carrier housing having a major plane that defines an x and y direction. The contacts are preferably loosely retained in the carrier housing such that each contact has at least some freedom of movement in the x and y direction.

In one particular implementation, each contact includes a first and second tapered cantilevered beam portion extending from a common fulcrum (e.g., “C”-shaped contacts). The beams may be tapered such that deflection of the respective beam occurs across substantially the entire length of the beam when a compression force is applied to the beam. The contacts may also include an inwardly depending member extending from the distal end of the cantilevered beam portions. These inwardly depending members may be configured to engage each other after the first and second cantilevered beam portions have been compressed a predetermined amount. Alternatively, the inwardly depending members may be configured to slide against each other causing the contact to rotate as a compression force is applied to the contact, thus creating a wipe motion at a mated interface when a compression force is applied to the contact.

In another aspect, the invention feature a circuit board that includes a substrate and an interconnection device mounted to the substrate. The interconnection device includes a housing formed of non-conductive material and having an upper and lower surface and cavities disposed on the upper surface of the housing and a plurality of non-formed compression contacts disposed within the respective cavities. The non-formed compression contacts each include a cantilevered beam portion that is tapered along its length. The cantilevered beam portion may be tapered such that deflection of the beam occurs across substantially the entire length of the beam when a compression force is applied to the beam.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1A:
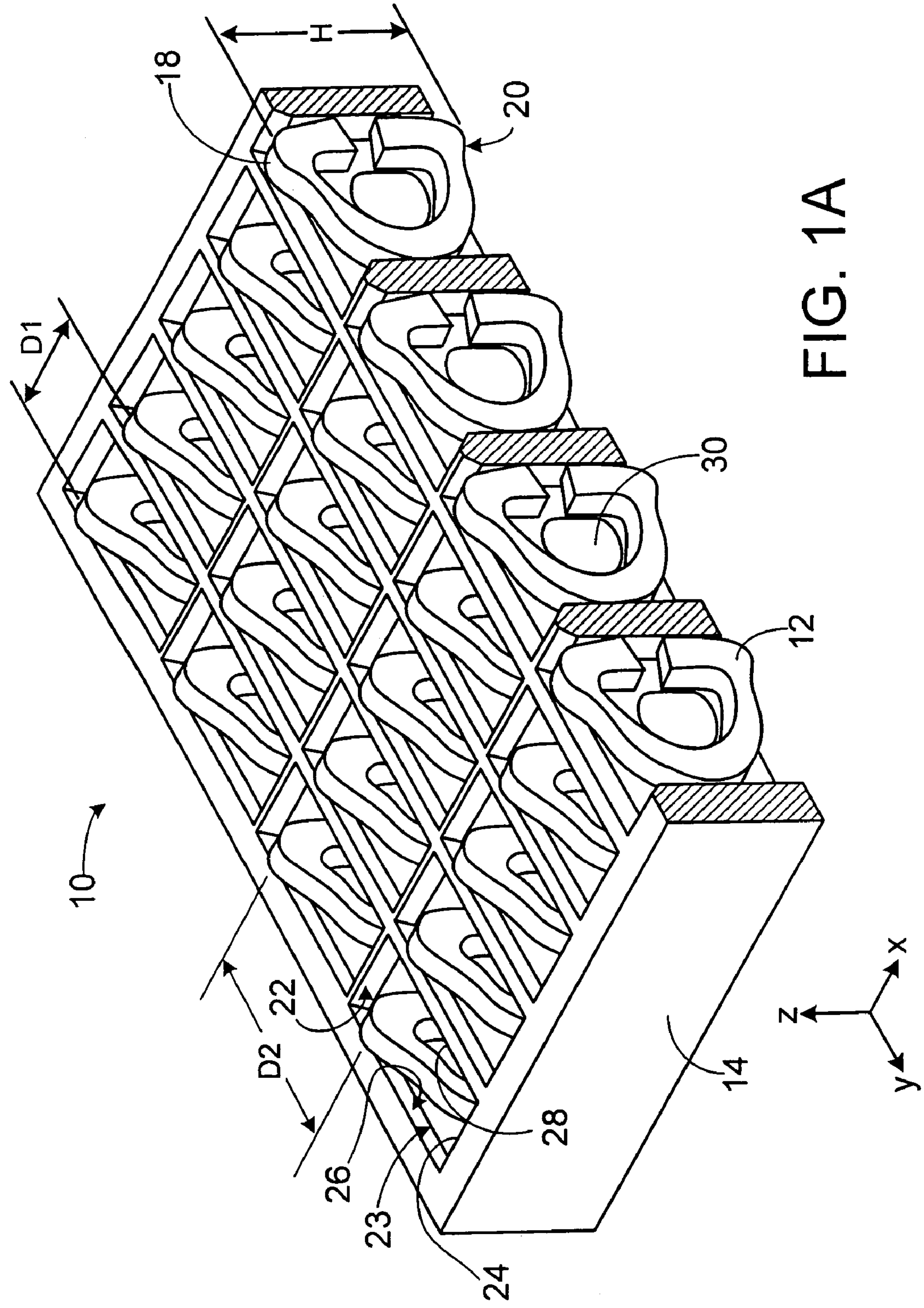
FIG. 1A is a cut-away plan view of a solderless compression interconnection device.
Figure 1B:
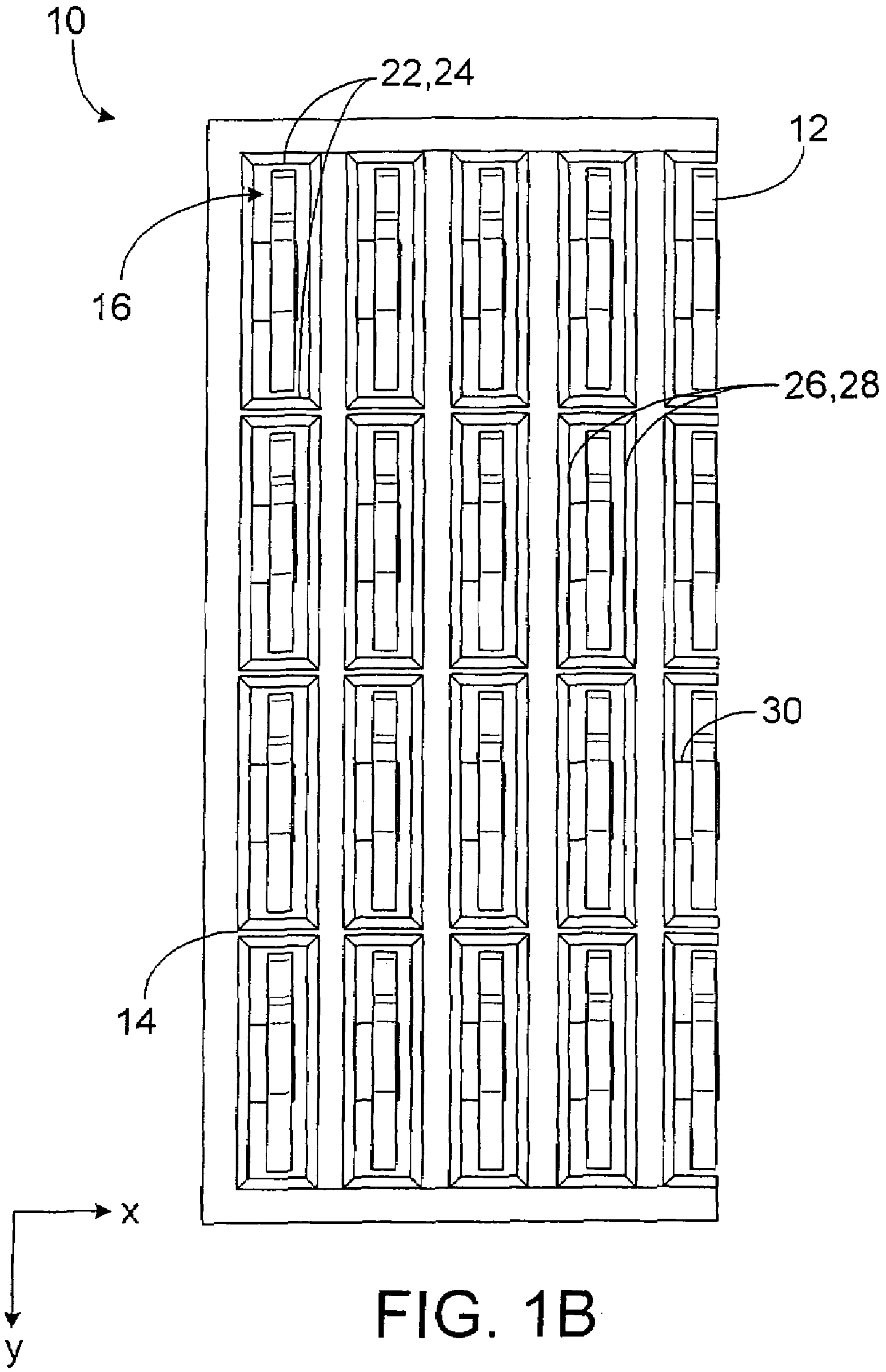
FIG. 1B is a top view of the interconnection device shown in FIG. 1A.

As shown in FIGS. 1A-1B, an interconnection device 10 includes an array of compression contacts 12 arranged within a corresponding array of cavities 16 within a carrier 14. As best shown in FIG. 1A, the contacting surfaces 18, 20 of the contacts 12 extend beyond the top and bottom surfaces of the carrier 14. Each of the cavities 23 are defined by two end walls 22, 24 and two sidewalls 26, 28 that extend from the top surface to the bottom surface of the carrier 14. A protrusion 30 extends from a sidewall (e.g., sidewall 20) into a corresponding cavity 16 and functions to loosely hold the contact 12 within the cavity 16. In the particular implementation illustrated, the contacts have a uncompressed height H of 1.01 millimeters (0.0398 inches), are spaced apart in the x-direction at a distance D1 of 0.50 millimeters (0.0197 inches), and are spaced apart in the y-direction at a distance D2 of 1.00 millimeter (0.0394 inches).

The contacts 12 are arranged in the same pattern, or footprint, as a corresponding electrical component (e.g., an active device, electrical cable, ceramic substrate, or a printed circuit board) to which the interconnection device 10 is to be terminated. In operation, the interconnection device 10 is disposed between two components that are to be electrically connected. A normal force (i.e., a force in the z-direction shown in FIG. 1A) is applied to the interconnection device, which causes each contact 12 to slide across its corresponding mating contacts. In one application, the interconnection device 10 may be permanently affixed to one component (e.g., a printed circuit card) and a clip, screw, bolt, mounting frame, or other releasable retention means may be used to releasably secure the other component in place. In another application, both components may be releasably attached to the interconnection device 10.

Figure 2A:
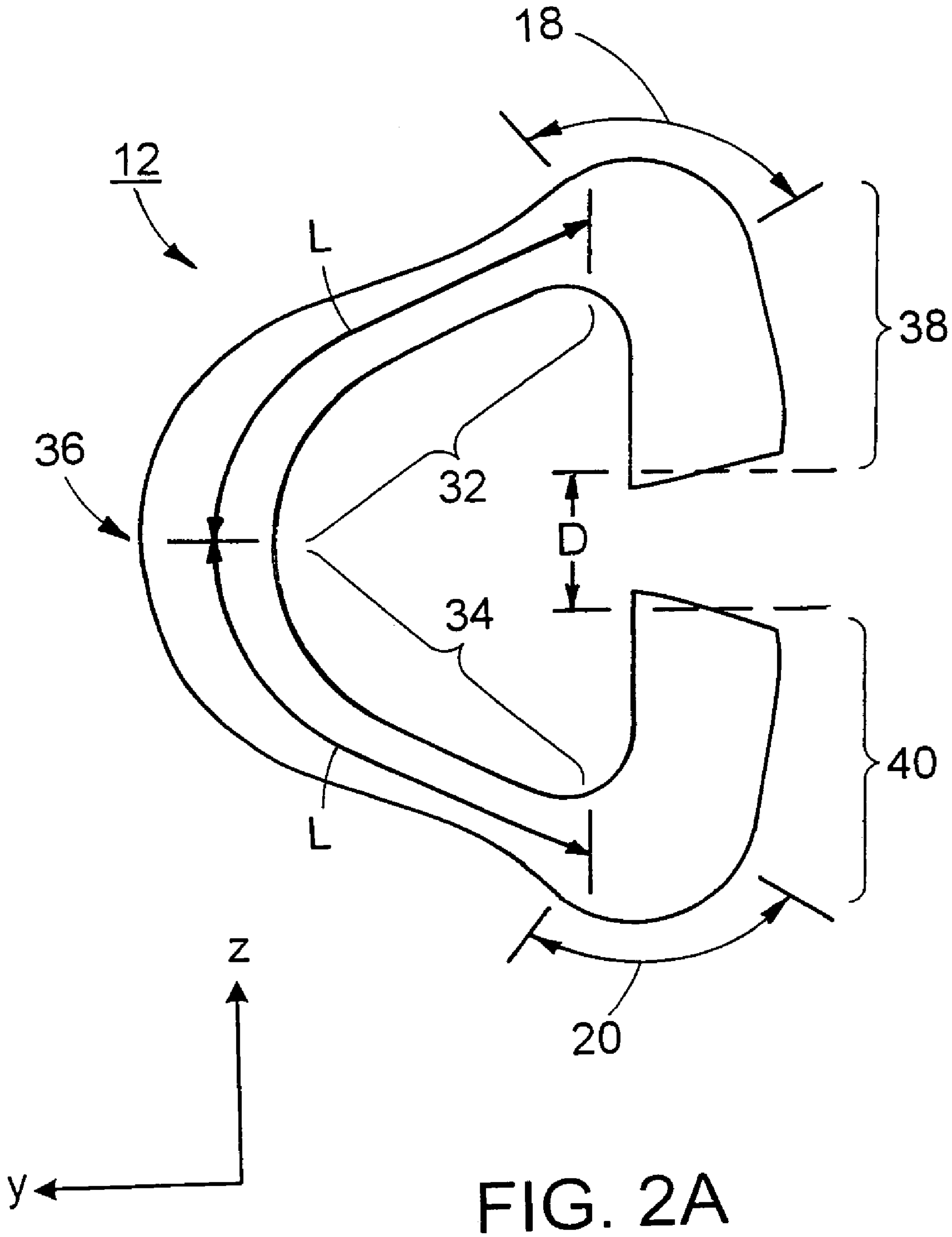
FIG. 2A is a side view of a contact from the interconnection device shown in FIG. 1A.

As shown in FIG. 2A, contact 12 includes two actuating cantilever beams 32, 34 that each project from a common fulcrum 36. Adjacent to the distal end of each cantilever beam 32, 34 is a contact surface area 18, 20 that forms the electrical connection between mating contacts of two components (e.g., an active device and a printed circuit board). The contact surface area 18, 20 is curved, which allows the contact 10 to slide against a mating contact as the contact 10 is compressed against a mating component and helps to avoid damage to the mating areas during engagement. Additionally, the curved contact surface facilitates a “wipe” against a mating contact to remove oxidation film that forms on the contacting surfaces of contact 10 and mating contacts. Adjacent to each contact surface area 16, 18, is an inwardly projecting prong 38, 40. The inwardly projecting prongs 16, 18 function to help hold the contact 10 in its cavity by partially surrounding the protrusion 30 formed in the carrier 14 (shown in FIG. 1A). The prongs 38, 40 are configured such that when the contact surfaces 18, 20 are at their maximum deflection (e.g., when they are flush with the top surface of the carrier 14) the prongs do not mate. Alternatively, the prongs 38, 40 may be configured to mate after the contact 10 has been compressed a certain distance D (shown in FIG. 2A) and thus limit how far contact 10 can be compressed.

Each cantilever beam 12, 14 is tapered along its length (shown as length L in FIG. 2A) which allows deflection to occur throughout the beam’s length, rather than concentrating deflection at a fulcrum point of a beam as would occur in a non-tapered beam. Such tapering provides an approximately uniform distribution of the stress generated during beam deflection along the length of the beam, thus reducing stress concentrations that could lead to structural failures in the contact 12. Such tapering also normalizes the tension and compression created at the beam’s central plane, which further reduces stress concentrations.

Figure 2B:
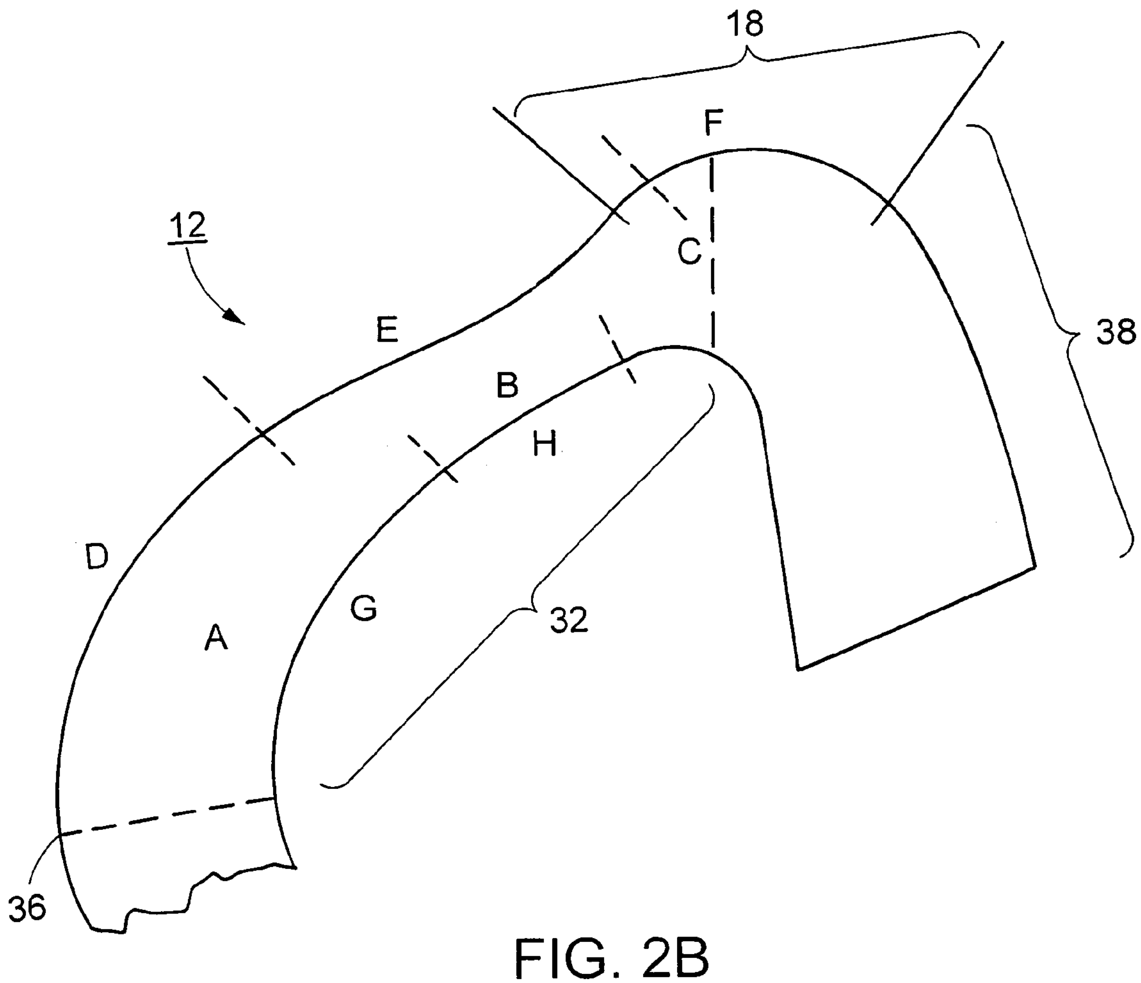
FIG. 2B is a partial view of the contact illustrated in FIG. 2A.

Referring to FIG. 2B, the cantilevered beam 12 tapers from a relatively thick portion (labeled as region “A” on FIG. 2B) near the fulcrum 36 to a narrower portion (labeled region “B”) towards the contacting surface 18 and then thickens again (labeled region “C”) at the distal end of the beam. The cantilevered beam 12 tapers such that the outer perimeter length of the beam 32 has a concave portion, D, near the fulcrum 36, a convex portion, E, towards the contacting surface 18, and another concave portion, F, at the distal end of the beam. Additionally, the cantilevered beam 12 tapers such that the inner perimeter length of the beam 32 has a generally concave portion, G, near the fulcrum 36 and a generally linear portion, H, located opposite the convex portion E in the outer perimeter. By tapering the beam in such a manner, the beam 32 deflects (or bends) not just near its fulcrum 36 (region A), but also in the region where the outer perimeter of the beam is convexly shaped (region B). In this implementation, the beam is tapered such that the stress imposed upon the beam by a normal force is approximately uniformly distributed across the beam’s length as may be shown by a finite elements analysis.

Design of a tapered cantilever beam may employ any of several known techniques for designing tapered cantilevered beams. One technique involves dividing a single, complex beam into several simpler structures that are each individually analyzed for geometric optimization. For example, when designing a cantilevered beam of a compression contact, several discrete beam segments may be initially designed by a designer-engineer and then improved using Maxwell’s equations and/or a finite elements analysis.

In one implementation, multiple subsegments of the cantilevered beam portion of a compression contact are designed by a designer-engineer. Each of the discrete beam segments of the initial design are then independently analyzed and improved (e.g., by hand calculations or using computer software) by applying Maxwell’s equations. Next, the individual segments are joined together using a suitable 3D CAD (Computer Aided Design) software program to form one contiguous beam structure. When joining the discrete beam segments, it is often preferable (although not required) to avoid utilizing the CAD software's auto-generating spline algorithms, which are algorithms that apply a best-guess mathematical solution to automatically transition objects joined together. Instead, the segment geometries are preferably manually defined as precisely shaped sizes with exact locations with respect to each other. This is not to infer that auto-spline generation is inaccurate or cannot be used in other implementations. However, complex non-uniform shapes are typically more accurately translated by CAM (Computer Aided Manufacturing) software tools when they are defined by actual dimensions located with respect to each other using polar coordinates versus input which depends on the interpretation of multiple algorithms which will require still further interpretation. While it generally takes more effort by a engineer-designer to manually join the segments (versus using CAD auto-spline feature), comparisons of manufactured items to analytical models have shown that accuracies of >90% are typically achieved when the manual approach is employed.

Once the individual segments have been joined and a unified structure has been created as described above, the information is be passed to a Finite Element Analysis (FEA) software tool for design optimization. When the geometry has been successfully imported into the FEA tool, the software is used to generate a geometric mesh which divides the structure into individual 3D elements called "nodes". The number of nodes may vary and is dependent upon the density of the mesh that has been selected. The number of nodes increases as mesh density increases and therefore has a direct relationship to the accuracy of the analysis. In one design, mesh density and node quantity were determined by the FEA software to be 22,700 nodes. Once the structure has been meshed, a finite elements analysis is performed. Because the beam is tapered, its moment of inertia is constantly changing throughout its length. Therefore, induced stress due to beam loading and displacement will react differently throughout the tapered length. Design optimization of the beam is accomplished by repetitive iterations whereby geometry is adjusted based upon individual analysis results to ensure that stress has been uniformly distributed throughout the length of the tapered beam without violating the material properties. In one design, the Max von Mises analysis was applied during all iterations of the FEA. However, those skilled in the practice of FEA analysis may elect to use other known analysis metrics.

Referring again to FIG. 2B, contact 12 is formed of an electrically conductive material that has a high modulus of elasticity and high yield strength, such as a spring tempered copper alloy (e.g., beryllium copper 172, 174 or 175). Contact 12 is non-formed, which means that it is made by a manufacturing process that does not substantially bend or deform the base material to create the shape of the contact. Die-cutting, punching, blanking, and stamping are examples of manufacturing processes that do not substantially bend or deform the base material to create the shape of a contact.

A manufacturing process that does not substantially bend or deform the base material to create the shape of the contact provides superior repeatability of the contact shape versus that of a forming process. For example, the accuracy of a die-cut process allows for control of the shape and proximity of the opposing contacting surfaces located adjacent to the distal ends of the cantilever beams shown in FIG. 2A such that the linear tolerance accumulation between the contacting surfaces is ±0.0020 inches. Creating a contact shape using a forming process is typically accomplished by bending the contact material over a sizing mandrel. This process compresses and stretches regions of the contact material to create its new shape. To maintain this new shape, the bending process will exceed the native yield strength characteristics of the contact material. The accuracy of a forming process controlling the shape and proximity of the opposing contacting surfaces located adjacent to the extents of the cantilever beams shown in FIG. 2A would yield a linear tolerance accumulation between the contacting surfaces of approximately ±0.0040 inches. To improve upon this tolerance accumulation during a forming process, it would be necessary to further exceed the contact materials native yield strength by increasing the amount of permanent set induced into the contact base material, thus forcing the material to maintain its new shape.

A manufacturing process that does not substantially bend or deform the base material to create the shape of the contact (e.g., die-cutting) imparts little influence on the native material characteristics of the base material. By maintaining the native material properties of the base material, such a manufacturing process will yield predictable and repetitive contacting pressures, e.g., the normal force, which are exerted at the opposing contacting surfaces shown in FIG. 2A.

Additionally, a manufacturing process that does not substantially bend or deform the base material to create the shape of the contact permits the formation of a contact that has a pair of cantilevered beams that are each tapered along their length. As previously mentioned, this tapering allows deflection to occur throughout the beam's length rather than isolated at the cantilever fulcrum. Such tapering provides uniform distribution of the stress generated during beam deflection across the length of each cantilevered beam and normalizes the tension and compression created at the beam's central plane thus reducing stress concentrations that could lead to structural failures in the beams during operation. The accurately controlled shape of the beams combined with the native base material characteristics provides a predictable, uniform spring rate and normal force.

Referring back to FIGS. 1A-1B, the carrier 14 is formed of an electrically non-conductive material so as to provide electrical isolation between adjacent cavities/contacts as well as electrical isolation between cavities/contacts and the perimeter of the carrier 14. Suitable material for the carrier 14 includes any known material for fabrication of interconnection carriers such as Liquid Crystal Polymer (LCP), Polybutylene Terephthalate (PBT), or Polyphenylene Sulfide (PPS).

In one implementation, the carrier 14 is made of a single piece construction and contacts 12 are installed by sliding the contacts 12 over and past the internal cavity protrusions 30 thus creating a mechanical detent within the contact cavity. Each detent orients and retains the contacts in a generally centered and symmetrical location between the sidewalls of the cavities and the top and bottom surfaces of the carrier. Detents may be located on either of the two sidewalls (e.g., sidewall 26 shown in FIG. 1B) or on both sidewalls to form an interlocking retention mechanism. These detents may be rigid structures or may be compliant and/or resilient so as to interact with the contact during the contact installation process. The cross-sectional shape of the internal cavity protrusion 30 can be circular, semi-circular (as shown in FIG. 1A) or of another shape that fits into the interior opening that is formed between the cantilever beams of the contact.

Figure 3:
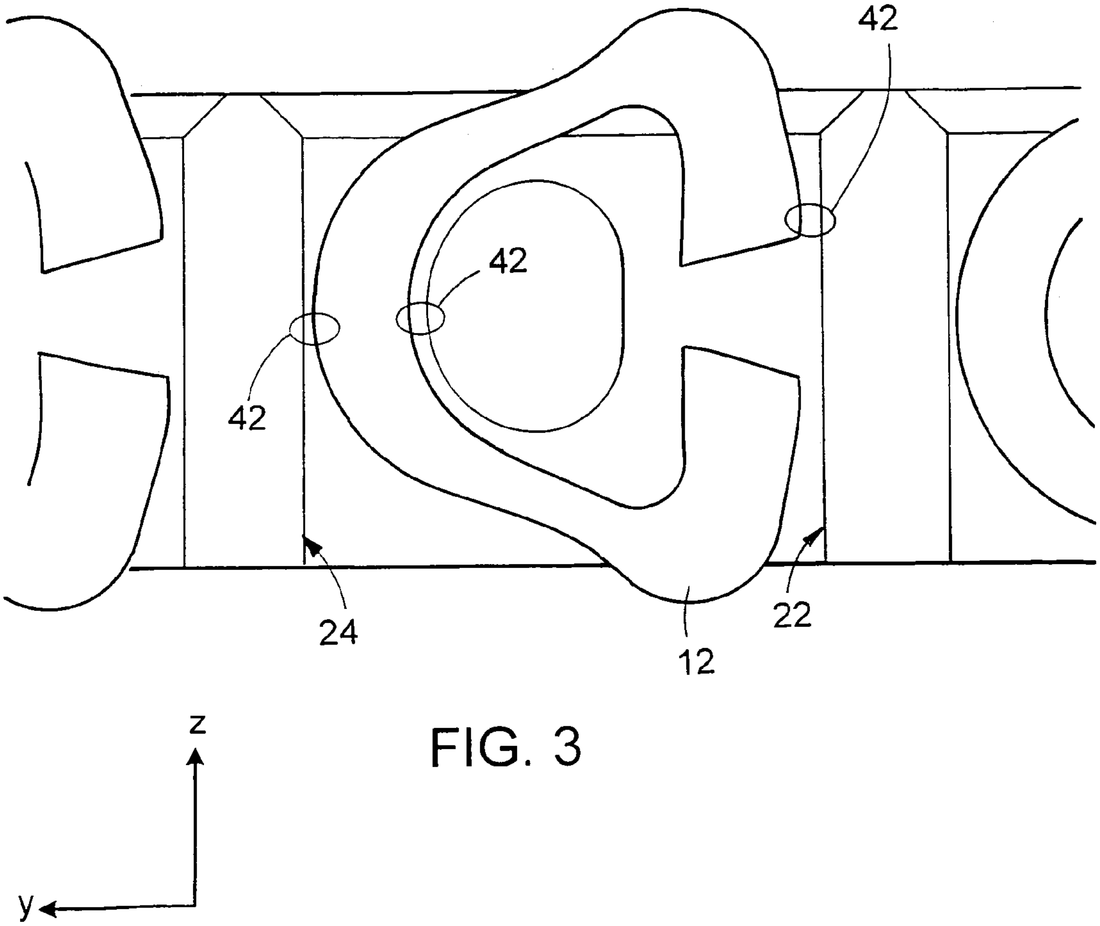
FIG. 3 is a cut-away side view of an uncompressed interconnection device.

The contacts 12 may be installed into the cavities from either the top or bottom surfaces of the carrier 14. Once the contacts are installed into the cavities and onto the mechanical detents which are located on the interior sidewalls of the cavities, the contacts are then oriented and retained within the cavities of the carrier. As shown in FIG. 3, the contacts 12 are loosely retained within their respective cavities (note the gaps 42 between the contact 12 and end walls 22, 24 and internal cavity protrusion 30) and are permitted to move independently and freely when subjected to the external forces or moments that are induced by mechanical actuation during termination to the active device (e.g., a semiconductor) and a ceramic substrate or a printed circuit board. More specifically, the contacts are loosely held within each of the cavities such that the contacts are permitted to move in the x, y, and/or z directions as indicated by the axis label shown on FIGS. 1A-3, 5. In another implementation, the contacts may be permitted to move only in the x and y directions.

One benefit produced by contact movement during actuation is the cleansing action or "wipe" which is imparted between the interconnecting surfaces. A film of oxide, organics, or other contaminates is known to form on contacting surfaces. This film is recognized as the largest component of a connection's electrical resistance. Therefore, to create an interface with the lowest possible electrical resistance, this film must be wiped away. As the contacting surfaces of contact 10 are actuated they travel through an actuate path which causes the physical point of contact to slide across the mated interface thus creating a wiping motion with respect to that interface. It should be understood that a carrier housing that allows compression contacts to move in the x, y, and/or z directions has application in any solderless compression interconnection device and not simply one that utilizes the particular contacts provided in this description.

Figure 4:
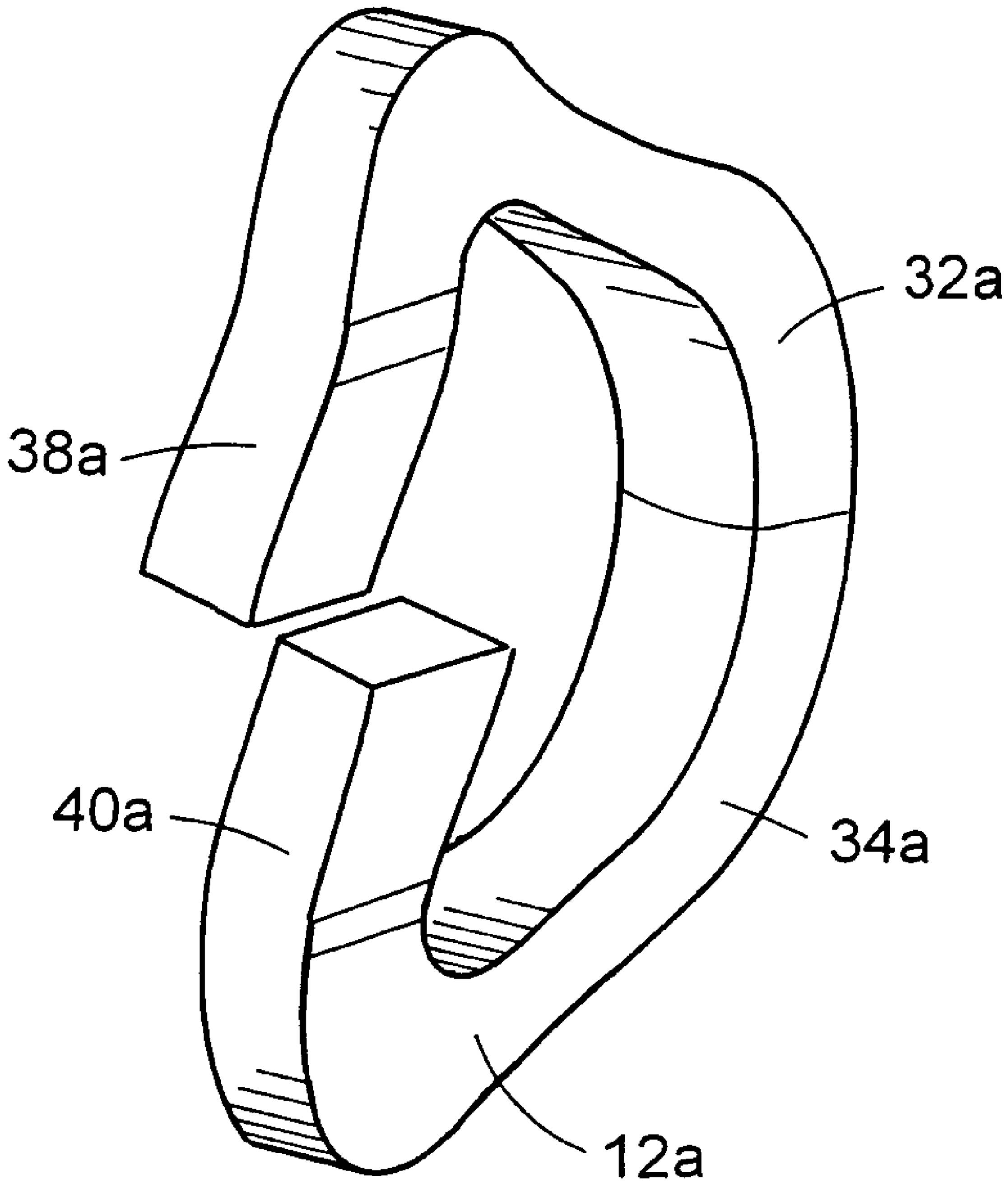
FIG. 4 is a perspective view of another contact for an interconnection device.

In another implementation, shown in FIG. 4, the inwardly protruding prongs 38*a*, 40*a* of a contact 12*a* may be shaped or formed such that the prongs 38*a*, 40*a* contact and slide past (bypass) each other during actuation thus producing a wiping action across the sliding surfaces of the prongs 38*a*, 40*a*.

Another means of producing the same offset planarity of the inwardly protruding prongs of the cantilever beams shown in FIG. 4 is to incorporate suitably shaped protrusions, i.e., two opposing inclined planes, one located on each of two opposite and parallel interior surfaces of the cavity sidewalls. During actuation the cantilever beam extents will slide upon the inclined planes producing the desired offset in planarity. This offset induces a torsion into the cantilever beams which creates a wipe motion at the mated interfaces which is normal to the direction of actuation and lateral to the direction of contact rotation.

Figure 5:
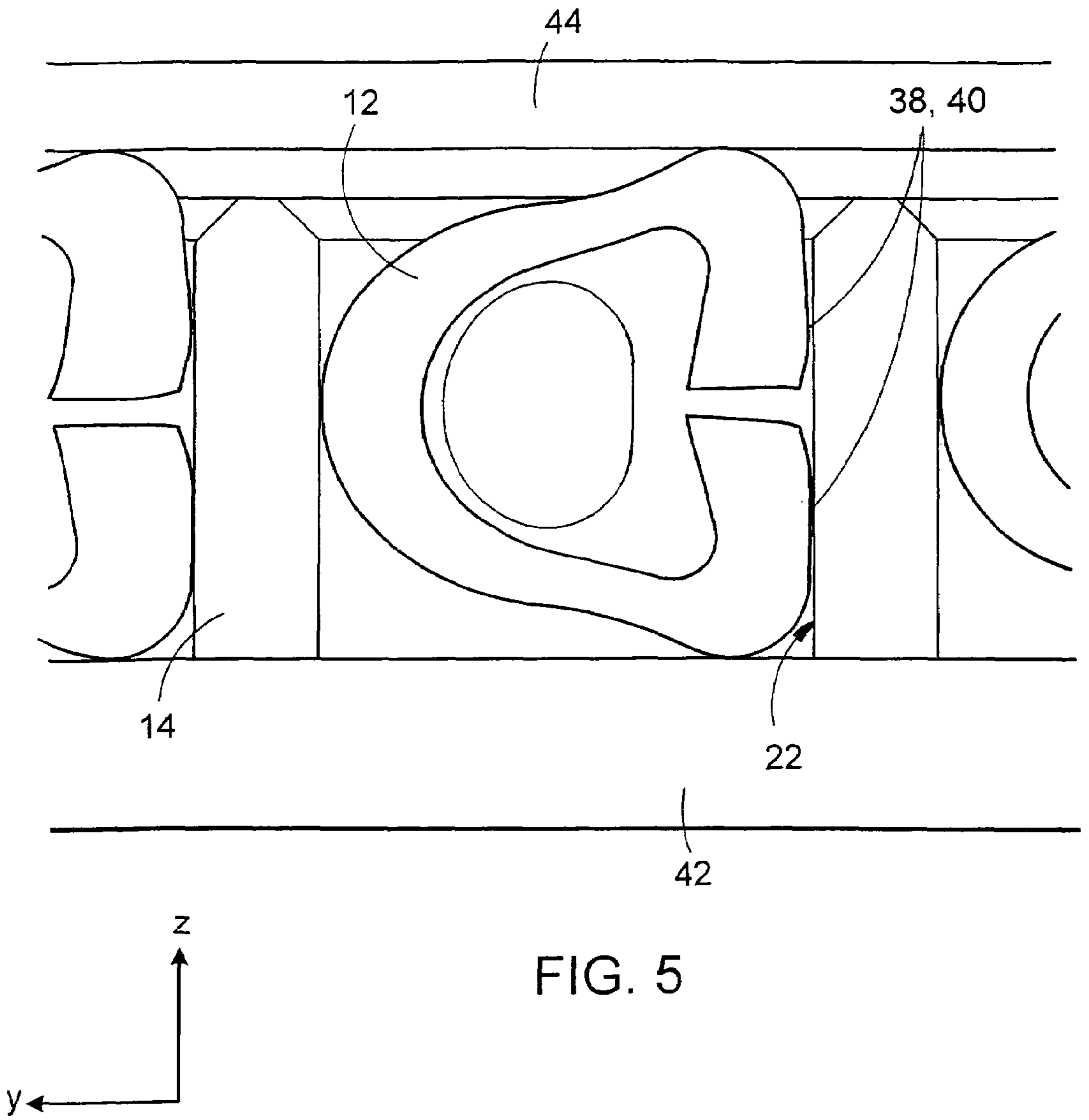
FIG. 5 is a cut-away side view of a compressed interconnection device.

The perimeter of the contact is shaped to limit rotation within its cavity. As shown in FIG. 5, when the contact 12 is in a fully terminated position between two components 42, 44, the inwardly projecting prongs 38, 40 of the contact form a vertical surface which are nearly parallel and in very close proximity to its cavities end wall 22. These features combined with the mechanical detent limit any resulting contact rotation. Preferably, at maximum rotation, the resultant contact normal forces exerted at the contacting surfaces provides a gas-tight solderless, electrical termination.

An interconnection device, such as device 10 shown in FIGS. 1A-1B, may be configured as an interposer that provides electrical connections between an active device (e.g., a semiconductor) and a ceramic substrate or printed circuit board. In this configuration, the interconnection device presents two individual contacts to each Land Grid Array (LGA) pad site on a 1.00 millimeter spaced LGA pattern. By terminating two independent contacts to each LGA pad, the interconnection component provides dual redundant termination points which compensates for any surface irregularities, surface flatness anomalies, and mechanical mounting variations. Contact termination is accomplished using a solderless compression interface between both the active device and the ceramic substrate or printed circuit card. A clip, screw, bolt, clamp, mounting frame, or other releasable attachment device may be used to secure the components to the interconnection device.

Each individual contact requires application of certain amount of normal force in order to produce a stable gas-tight electrical connection between the contact's contacting surface and a mated component. For example, if the mating terminating interfaces of the LGA pad sides are gold plated, a normal force of 30 grams minimum is required to produce a single, stable gas-tight electrical connection between each of the contact's contacting surfaces and a mated component. Higher normal forces will be required if non-noble plating is used. In a high-density interconnection device, the aggregate normal force can become substantial and the contacting surfaces of the contact array can transmit significant strain (shear and bending stress) at the termination sites on the mated components. For example, a 1806 square millimeter (~2.8 sq. inch) active device module with a 1.00 millimeter (~0.0394 inch) spaced LGA pattern can provide an interconnection density of 1247 terminations, and, if each mated termination site exerts a force of 30 grams (1.06 ounces), the aggregate normal force exerted on the active device is approximately 1468 Newtons (330 pounds). Excessive strain at the termination sites effects the long-term reliability of the electrical connections. In extreme instances strain causes physical damage to the interconnected "joint" by breaking the gas-tight connection. It also introduces an opportunity for creep corrosion to propagate within the joint which increases electrical resistance and may ultimately lead to joint failure.

Thermally induced strain is caused by the differences in the coefficient of thermal expansion (CTE) of the different materials which comprise the carrier, printed circuit board or ceramic substrate, and the active device, (semiconductor). Additionally, thermal differentials exacerbate the CTE mismatch between the assembled components. As presented in J. S. Corbin et al., *Land Grid Array Sockets for Server Applications*, IBM Publication #0018-8646/02, Nov. 6, 2002, the strain in a particular solder joint can be represented as:

$$\epsilon=\psi(T-T_0)(\alpha_{ad}-\alpha_{pcb}) \text{ where:}$$

$\epsilon$(epsilon)=the strain components, $\psi$(Psi)=a geometric shape function, T and $T_0$ (Tau)=the actual and reference temperatures respectively, and $\alpha_{ad}$ and $\alpha_{pcb}$ (alpha)=CTE of the active device and the PCB or ceramic substrate respectively.

While the interconnection device 10 shown in FIGS. 1A-1B employs a solderless compression termination technique in its application to printed circuit boards, ceramic substrates, and active devices, the strain formula provided above can be applied to a solderless compression termination device as well. In order to reduce the $(\alpha_{ad}-\alpha_{pcb})$ component of the strain equation, the carrier 14 is preferably manufactured from a raw material that more closely matches the CTE of the active device and the PCB or ceramic substrate. Additionally, by allowing the contacts to move independently and freely when subjected to the external forces or moments which are induced by the differential thermal expansion between components, the interconnection device 10 shown in FIGS. 1A-1B reduces the magnitude of $\psi$, (Psi), and thus reduces the overall strain induced into its solderless compression termination sites. More specifically, a plurality of floating contacts reduces the magnitude of Psi because it provides an interconnect that is highly compliant in shear, while maintaining adequate shear and tensile strength to prevent damage to the interconnected "joint" and avoid failure. Therefore, allowing the contacts to move compensates for any CTE mismatch in the different materials of the carrier and the mating components. The contacts are allowed to shift independently within their respective cavities to absorb the differing amounts of thermal expansion that are created by the material mismatch from one terminating surface to another.

High performance systems require any interconnection technology to preserve signal fidelity, operate at very high frequencies and deliver information at very high data rates. In order to meet those system goals, an interconnection component or connector should possess enhanced electrical characteristics. To this end, the impedance, inductance, and capacitance of the contacts is reduced to the lowest possible values so that acceptable rise times and signal propagation characteristics can be achieved. To maximize its high speed signal transmission capabilities, an interconnection device may be designed to have a very low profile, ≦1.0 millimeter (0.0394 inches), thus minimizing vertical separation between the two mating components. In some applications, it may be desirable to slow the data rate from an active device prior to injecting these signals into the substrate or system board. To satisfy this system level need, the profile of the interconnection device may be increased (and thus also the electrical path length of the contacts) to reduce the transmission speed of the interconnection device. Adjustments to path length and profile will increase inductance and signal propagation speed through the interconnection device, thus providing the balance previously mentioned. By utilizing full wave modeling and simulation software, the exact mechanical adjustments may be predetermined and the resultant electrical performance examined.

A number of embodiments of the invention have been described. Nevertheless, it will be understood that various modifications may be made without departing from the spirit and scope of the invention.

For example, while the interconnection device shown in FIGS. 1A-1B has been shown and described largely as a interposer assembly configured to interconnect an active device (e.g., a semiconductor) with an PCB or ceramic substrate, an interconnection device may be configured as any type of interconnection device such as, but not limited to a transition connector, a Ball Grid Array (BGA) socket assembly, a Land Grid Array (LGA) socket assembly, a board-to-board connector, a cable-to-board connector, a cable-to-cable connector, a replaceable chip module, a multi-chip module or any number of electrical or electronic interconnecting applications that use a separable, solderless termination.

Additionally, while the carrier of the interconnection device has been described as a single piece construction, the carrier may be manufactured in several pieces that are attached together. For example, the carrier may be a two-piece construction, with an upper half and a lower half. During assembly of the interconnection unit, contacts could first be placed in one of the halves and then the other half of the carrier would be attached. Alternatively, the carrier may also be manufactured in a series of segments that may be interlocked or otherwise attached together. For example, the outer surfaces of interconnection device 10 could include a series of tabs and corresponding slots that would enable several devices to be interlocked together. Accordingly, other implementations are within the scope of the following claims.

The invention claimed is:

1. A method of manufacture of an interconnection device comprising:

using a non-forming process to manufacture a plurality of compression contacts, each compression contact including a cantilevered beam portion that is tapered along its length; and disposing each of the plurality of contacts within a respective cavity in a substantially planar carrier housing lying in a plane defined by mutually perpendicular x and y axes, the housing having an upper surface and a lower surface, each cavity extending between the upper and lower surfaces of the housing substantially along a z axis mutually perpendicular to the x and y axes, each contact being loosely retained within its respective cavity such that an entirety of the contact in a compressed state has at least some freedom of movement along the x and y axes.

2. The method of claim 1 wherein the non-forming process comprises die-cutting contacts from a base material.

3. The method of claim 1 wherein the non-forming process comprises stamping contacts from a base material.

4. The method of claim 1 wherein the non-forming process comprises punching contacts from a base material.

5. The method of claim 1 wherein the non-forming process comprises blanking contacts from a base material.

6. The method of claim 1 wherein the cantilevered beam portion of each contact is tapered such that deflection of the beam occurs across substantially the entire length of the beam when a compression force is applied to the beam.

7. The method of claim 1 wherein the cantilevered beam portion of each contact is tapered such that an outer surface of the cantilevered beam has a generally concave shape near the fulcrum of the beam and a generally convex shape near the distal end of the beam.

8. The method of claim 1 wherein each contact further comprises:

a second cantilevered beam portion having a length and projecting from the same fulcrum as the first cantilevered beam portion, wherein the second cantilevered beam portion is also tapered along its length.

9. The method of claim 8 wherein the first and second cantilevered beam portions of each contact are each tapered such that deflection of the respective beam occurs across substantially the entire length of the beam when a compression force is applied to the beam.

10. The method of claim 1 wherein each contact is loosely retained in its respective cavity such that the contact has at least some freedom of movement in the direction perpendicular to the x and y axes.

11. The method of claim 1 wherein each contact is loosely retained in its respective cavity such that the contact slides against a respective contact pad during engagement.

12. The method of claim 1 wherein each contact further comprises:

an inwardly depending member extending from the distal end of the cantilevered beam portion.

13. The method of claim 12, wherein each contact further comprises:

a second cantilevered beam portion having a length and projecting from the same fulcrum as the first cantilevered beam portion, wherein the second cantilevered beam portion is also tapered along its length.

14. The method of claim 13, wherein each contact further comprises:

a second inwardly depending member extending from the distal end of the second cantilevered beam portion.

15. The method of claim 14 wherein the first and second inwardly depending members of each contact are adapted to engage each other after the first and second cantilevered beam portions have been compressed a predetermined amount.

16. The method of claim 15 wherein the first and second inwardly depending members of each contact are adapted to slide against each other causing the contact to rotate as a compression force is applied to the contact.

17. The method of claim 16 wherein each contact is loosely retained in the carrier housing such that a wipe motion at a mated interface is generated as a compression force is applied to the contact, wherein the wipe motion is in a direction that is normal to the direction of the compression force and lateral to a direction of contact rotation.

18. The method of claim 1 wherein each cavity is defined by walls that extend between the upper surface and the lower surface of the housing.

19. The method of claim 18 wherein the housing comprises at least one internal cavity protrusion that extends from at least one of the walls that defines a first of the plurality of cavities.

20. The method of claim 19, wherein a first of the plurality of contacts disposed within the first of the plurality of cavities at least partially surrounds the protrusion.

21. The method of claim 1, wherein the housing comprises a single piece construction.

22. The method of claim 1, wherein the housing comprises a multi-piece construction.

23. A method of manufacture of an interconnection device comprising:

using a non-forming process to manufacture a plurality of compression contacts, each compression contact including a cantilevered beam portion that is tapered along its length; and disposing each of the plurality of contacts within a respective cavity in a carrier housing, the housing being formed of a non-conductive material and having an upper and lower surface, each cavity being defined by side walls and end walls that extend between the upper surface and the lower surface of the housing, each contact and its respective cavity being configured so that a clearance remains between the contact and the walls that defined the cavity when the contact is in a compressed state, the clearance permitting motion of an entirety of the contact in the compressed state with respect to the walls that define the cavity.

24. The method of claim 23 wherein the non-forming process comprises die-cutting contacts from a base material.

25. The method of claim 23 wherein the non-forming process comprises stamping contacts from a base material.

26. The method of claim 23 wherein the non-forming process comprises punching contacts from a base material.

27. The method of claim 23 wherein the non-forming process comprises blanking contacts from a base material.

28. The method of claim 23 wherein the cantilevered beam portion of each contact is tapered such that deflection of the beam occurs across substantially the entire length of the beam when a compression force is applied to the beam.

29. The method of claim 23 wherein the cantilevered beam portion of each contact is tapered such that an outer surface of the cantilevered beam has a generally concave shape near the fulcrum of the beam and a generally convex shape near the distal end of the beam.

30. The method of claim 23 wherein each contact further comprises:

a second cantilevered beam portion having a length and projecting from the same fulcrum as the first cantilevered beam portion, wherein the second cantilevered beam portion is also tapered along its length.

31. The method of claim 30 wherein the first and second cantilevered beam portions of each contact are each tapered such that deflection of the respective beam occurs across substantially the entire length of the beam when a compression force is applied to the beam.

32. The method of claim 23 wherein the device is substantially planar and lies in a plane defined by mutually perpendicular x and y axes.

33. The method of claim 32 wherein each contact is loosely retained in its respective cavity such that the contact has at least some freedom of movement along the x and y axes.

34. The method of claim 32 wherein each contact is loosely retained in its respective cavity such that the contact has at least some freedom of movement in the direction perpendicular to the x and y axes.

35. The method of claim 23 wherein each contact is loosely retained in its respective cavity such that the contact slides against a respective contact pad during engagement.

36. The method of claim 23 wherein each contact further comprises:

an inwardly depending member extending from the distal end of the cantilevered beam portion.

37. The method of claim 36, wherein each contact further comprises:

a second cantilevered beam portion having a length and projecting from the same fulcrum as the first cantilevered beam portion, wherein the second cantilevered beam portion is also tapered along its length.

38. The method of claim 37, wherein each contact further comprises:

a second inwardly depending member extending from the distal end of the second cantilevered beam portion.

39. The method of claim 38 wherein the first and second inwardly depending members of each contact are adapted to engage each other after the first and second cantilevered beam portions have been compressed a predetermined amount.

40. The method of claim 39 wherein the first and second inwardly depending members of each contact are adapted to slide against each other causing the contact to rotate as a compression force is applied to the contact.

41. The method of claim 40 wherein each contact is loosely retained in the carrier housing such that a wipe motion at a mated interface is generated as a compression force is applied to the contact, wherein the wipe motion is in a direction that is normal to the direction of the compression force and lateral to a direction of contact rotation.

42. The method of claim 23 wherein each cavity is defined by walls that extend between the upper surface and the lower surface of the housing.

43. The method of claim 42 wherein the housing comprises at least one internal cavity protrusion that extends from at least one of the walls that defines a first of the plurality of cavities.

44. The method of claim 43, wherein a first of the plurality of contacts disposed within the first of the plurality of cavities at least partially surrounds the protrusion.

45. The method of claim 23, wherein the housing comprises a single piece construction.

46. The method of claim 23, wherein the housing comprises a multi-piece construction.

* * * * *